United States Patent
Shin et al.

(10) Patent No.: US 10,334,752 B2
(45) Date of Patent: Jun. 25, 2019

(54) HEAT DISSIPATION UNIT FOR WIRELESS CHARGING AND WIRELESS POWER CHARGING MODULE COMPRISING SAME

(71) Applicant: AMOGREENTECH CO., LTD., Gyeonggi-do (KR)

(72) Inventors: Hwi Chul Shin, Gyeonggi-do (KR); Jong Eun Kim, Gyeonggi-do (KR); Jae Hyung Seo, Chungcheongbuk-do (KR)

(73) Assignee: AMOGREENTECH CO., LTD., Gyeonggi-do (KR)

( * ) Notice: Subject to any disclaimer, the term of this patent is extended or adjusted under 35 U.S.C. 154(b) by 0 days.

(21) Appl. No.: 15/563,935

(22) PCT Filed: Mar. 22, 2016

(86) PCT No.: PCT/KR2016/002843
§ 371 (c)(1),
(2) Date: Oct. 2, 2017

(87) PCT Pub. No.: WO2016/159551
PCT Pub. Date: Oct. 6, 2016

(65) Prior Publication Data
US 2018/0132376 A1 May 10, 2018

(30) Foreign Application Priority Data

Apr. 2, 2015 (KR) ........................ 10-2015-0046965
Aug. 4, 2015 (KR) ........................ 10-2015-0110180

(51) Int. Cl.
*H05K 7/20* (2006.01)
*H01F 27/36* (2006.01)
(Continued)

(52) U.S. Cl.
CPC ............... *H05K 7/20* (2013.01); *H01F 27/22* (2013.01); *H01F 27/36* (2013.01); *H01F 38/14* (2013.01);
(Continued)

(58) Field of Classification Search
CPC ..................................................... H01F 27/36
See application file for complete search history.

(56) References Cited

U.S. PATENT DOCUMENTS

| 7,492,260 B2* | 2/2009 | Waters ............. G06K 19/07749 340/572.1 |
| 2011/0050164 A1* | 3/2011 | Partovi ................... H01F 5/003 320/108 |

(Continued)

FOREIGN PATENT DOCUMENTS

| JP | 2014011852 A | 1/2014 |
| JP | 2015-505166 A | 2/2015 |

(Continued)

OTHER PUBLICATIONS

WIPO, Korean International Search Authority, International Search Report dated Jun. 27, 2016 in International Patent Application No. PCT/KR2016/002843, 7 pages.

*Primary Examiner* — Mukundbhai G Patel
(74) *Attorney, Agent, or Firm* — Masuvalley & Partners

(57) ABSTRACT

Provided are a heat dissipation unit for wireless charging and a wireless power charging module comprising the same. The heat dissipation unit for wireless charging, according to one exemplary embodiment of the present invention, is formed of a plate-shaped substrate layer having a predetermined area to discharge to the outside heat occurring during wireless charging, and comprises at least one slot having a predetermined length. By having at least one slot, the present invention can satisfy all properties required in a (Continued)

wireless charging method, which are charging efficiency and a heat dissipation effect.

16 Claims, 8 Drawing Sheets

(51) Int. Cl.
| | |
|---|---|
| *H01Q 1/22* | (2006.01) |
| *H02J 7/02* | (2016.01) |
| *H01Q 1/02* | (2006.01) |
| *H01F 27/22* | (2006.01) |
| *H01F 38/14* | (2006.01) |
| *H04B 5/00* | (2006.01) |
| *H02J 50/10* | (2016.01) |

(52) U.S. Cl.
CPC ................ *H01Q 1/02* (2013.01); *H01Q 1/22* (2013.01); *H02J 7/02* (2013.01); *H02J 50/10* (2016.02); *H04B 5/0031* (2013.01); *H04B 5/0037* (2013.01); *H02J 7/025* (2013.01)

(56) References Cited

U.S. PATENT DOCUMENTS

2015/0269477 A1\* 9/2015 Finn ................. G06K 19/07794
235/492
2016/0043461 A1\* 2/2016 Murayama ............... H01Q 7/06
343/702

FOREIGN PATENT DOCUMENTS

| KR | 10-2012-0029433 A | 3/2012 |
|---|---|---|
| KR | 10-2013-0072181 A | 7/2013 |
| KR | 10-2014-0101665 A | 8/2014 |
| KR | 10-2014-0111799 A | 9/2014 |

\* cited by examiner (a) Chemical treatment      (b) Heat treatment

HEAT DISSIPATION UNIT FOR WIRELESS CHARGING AND WIRELESS POWER CHARGING MODULE COMPRISING SAME

RELATED APPLICATIONS

This application is the U.S. National Phase of and claims priority to International Patent Application No. PCT/KR2016/002843, International Filing Date Mar. 22, 2016, entitled Heat Dissipation Unit For Wireless Charging And Wireless Power Charging Module Comprising Same; which claims benefit of Korean Application No. KR10-2015-0046965 filed Apr. 2, 2015; and Korean Application No. KR10-2015-0110180 filed Aug. 4, 2015; all of which are incorporated herein by reference in their entireties.

TECHNICAL FIELD

The present disclosure relates to a heat dissipation unit, and more particularly, to a heat dissipation unit for wireless charging, capable of effectively dissipating heat generated during wireless charging, and a wireless power charging module including the same.

BACKGROUND ART

Recently, various functions, such as Radio Frequency Identification (RFID), Near Field Communication (NFC), Wireless Power Transfer (WPT) and an interactive pen tablet function, have been added to potable terminals, including mobile phones, tablet PCs and the like.

NFC is a technology to transmit data between terminals at a close distance of 10 cm in which a non-contact type short-range wireless communication module using a 13.56 Mz frequency band is used as one of RFID tags. NFC is widely used not only for mobile payment but also for transfer of information regarding goods and travel information for visitors, transportation, access control locks in supermarkets or shops by file transfer method.

In addition, 'Android Beam,' included in the smart phone system recently announced by Google, has an NFC-based short range information transmission and reception function to supports the transfer of data regarding photos, business cards, files, maps, and websites from one phone to another, as well as mobile payments.

A portable terminal is provided with a wireless charging function for wirelessly charging a built-in battery. Such wireless charging is performed by a wireless power receiving module built in a portable terminal and a wireless power transmitting module supplying power to the wireless power receiving module.

In addition, the wireless charging may be categorized as a magnetic induction method and a self-resonance method, and may be categorized as a PMA type and a Qi type depending on the method of detecting an access of wireless power receiving module to wireless power transmitting module.

At least one of the wireless power transmitting module and the wireless power receiving module is provided with a heat dissipating member outwardly discharging heat generated during wireless charging to increase the charging efficiency.

For example, graphite having a high thermal conductivity is usually used as a heat dissipating member. However, graphite has the following problems.

The graphite is excellent in heat dissipating effect since graphite is a high thermal conductivity material. However, graphite provides low charging efficiency, since severe eddy currents occur due to low resistance and the like. Therefore, there is a demand for a method able to improve charging efficiency while providing a superior heat dissipation effect.

DISCLOSURE OF INVENTION

Technical Problem

As a result of repeated intensive studies and experiments, it has been found that, when at least one slot having a predetermined length is formed in the surface of a base layer of a heat dissipation unit, in particular, when a slot is formed in the surface of a base layer in a direction orthogonal to an antenna pattern for wireless charging, it is possible to effectively suppress eddy currents generated on the surface of the base layer, thereby improving charging efficiency.

The present disclosure has been made in view of the above-stated finding, and an object of the present disclosure is to provide a heat dissipation unit for wireless charging able to reduce eddy currents while maintaining the thermal conductivity of a base layer.

Another object of the present disclosure is to provide a heat dissipation unit for wireless charging able to reduce heat generation by suppressing eddy currents, thereby improving heat dissipation effect.

A further object of the present disclosure is to provide a wireless power charging module that can improve heat dissipation effect and charging efficiency required in a wireless charging method.

Technical Solution

One aspect of the present disclosure provides a heat dissipation unit for wireless charging which may include a sheet-shaped base layer having a predetermined area through which heat generated during wireless charging is discharged outwardly, the base layer having at least one slot having a predetermined length.

In a preferred embodiment of the present disclosure, the slot may be disposed at a position corresponding to a pattern of an antenna for wireless charging, except for an area corresponding to an application processor to improve a heat dissipation characteristic.

In addition, the slot may be extended in a direction orthogonal to the pattern of the antenna.

In addition, the slot may be extended through one of top and bottom of the base layer.

In addition, the slot may extend to an edge of the base layer.

In addition, the base layer may have a through-hole in a central portion thereof, and the slot may extend to the through-hole or extend from the through-hole to an edge of the base layer.

In addition, the base layer may be made of one selected from among Cu, Al, graphite, and combinations thereof.

In addition, the heat dissipation unit for wireless charging may further include a heat conductive adhesive disposed on one or more surface of a top surface and a bottom surface of the base layer.

In addition, the heat dissipation unit for wireless charging may further include an oxide film disposed on one or more surface of a top surface and a bottom surface of the base layer.

Another aspect of the present disclosure provides a wireless power charging module which may include at least one antenna unit; a shielding unit disposed on a surface of the antenna unit to induce a magnetic field; and the heat dissipation unit, wherein the heat dissipation unit includes a sheet-shaped base layer having a predetermined area disposed on a surface of the shielding unit to discharge heat.

In a preferred embodiment of the present disclosure, the antenna unit may include at least one of a wireless charging antenna, a near field communication (NFC) antenna, and a magnetic secure transmission (MST) antenna.

In addition, the shielding unit may include a first sheet layer for improving a characteristic of the wireless charging antenna and a second sheet layer for improving a characteristic of the NFC antenna.

In addition, the first sheet layer may be a ribbon sheet made of an amorphous alloy or a nano-crystalline alloy, and the second sheet layer is a ferrite sheet.

In addition, at least one of the first sheet layer and the second sheet layer may be comprised of a plurality of fine pieces divided into irregular shapes, adjacent fine pieces among the plurality of fine pieces being totally insulated or partially insulated from each other.

Another aspect of the present disclosure provides a heat dissipation unit for wireless charging which may include a metal thin film having a thermal conductivity equal to or higher than a predetermined level of thermal conductivity, wherein the metal thin film sheet includes an oxide film layer disposed on one surface or both surfaces to improve high-resistance properties and emissivity of the surfaces, wherein the metal thin film sheet has at least one slot having a predetermined length, and wherein the heat dissipation unit is installed in a shielding unit of a wireless power charging module to dissipate heat generated from a heat source.

In a preferred embodiment of the present disclosure, the metal thin film sheet may be a copper foil.

Advantageous Effects

According to the present disclosure, at least one slot having a predetermined length formed in the base layer of the heat dissipation unit can reduce heat generation due to eddy current loss by reducing eddy currents and can impress heat dissipation effect.

In addition, the present disclosure can improve wireless charging efficiency by reducing eddy current loss using at least one slot formed in the base layer.

MODE FOR DISCLOSURE

Figure 1:
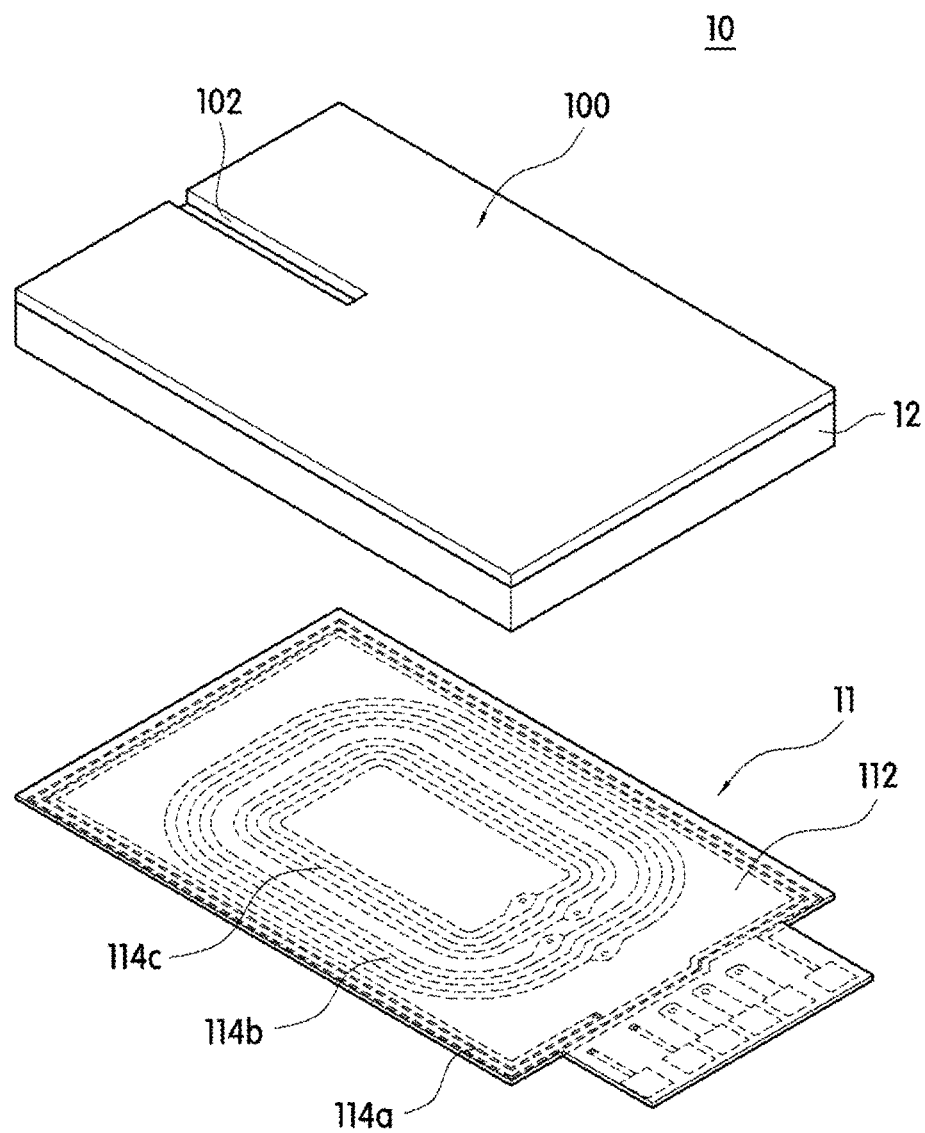
FIG. 1 is a perspective view schematically illustrating a wireless power charging module according to an embodiment of the present disclosure.

Hereinafter, embodiments of the present disclosure will be described in detail with reference to the accompanying drawings so that those skilled in the art can easily carry out the present disclosure. The present disclosure may be embodied in many different forms and is not limited to the embodiments described herein. In the drawings, parts not relating to the description may be omitted for clarifying the present disclosure, and the same reference numerals may be assigned to the same or similar components throughout the specification.

First, referring to FIG. 1, a wireless power charging module 10 according to an embodiment of the present disclosure includes an antenna unit 11, a shielding unit 12, and a heat dissipation unit 100.

The antenna unit 11 is for transmitting or receiving a high frequency radio (or wireless) signal to or from a portable electronic device, such as a cellular phone, a personal digital assistant (PDA), a portable multimedia player (PMP), a tablet, a multimedia device, and the like.

The antenna unit 11 may be a single antenna unit or a plurality of antenna units provided on one surface of the shielding unit 12. The antenna unit 11 is fixed to one surface of the shielding unit 12 via an adhesive layer.

Here, the adhesive layer may be an adhesive having adhesive properties, polyvinyl chloride (PVC), rubber, double-sided tape, or the like, and may contain a conductive component.

The antenna unit 11 may be implemented as a flat coil wound clockwise or counterclockwise and having a polygonal shape, such as a circular, elliptical, spiral, or rectangular shape, or may be implemented by etching a metal foil, such as a copper foil.

In addition, the antenna unit 11 may have a pattern printed on a circuit board 112, one surface of which is attached to one surface of the shielding unit 12.

The circuit board 112 is an element provided as a base on the top surface of which at least one antenna pattern and circuit elements are disposed, and is mad of a material that is heat resistant, pressure resistant, and flexible. In consideration of the physical properties of such a material, a film of thermosetting polymer, such as polyimide (PI) or polyethylene terephthalate (PET), may be used as the circuit board 112.

Connection terminals for electrical connection with the circuit board 112 protrude from both ends of the antenna unit 11.

The antenna unit 11 is provided to transfer electric power using an inductive coupling method based on electromagnetic induction using transmitted or received wireless power signals, such that the antenna unit 11 can serve as a receiving antenna or as a transmitting antenna.

Such a magnetic induction charging technique is well known in the art, and thus a detailed description thereof will be omitted.

The antenna unit 11 includes at least one antenna that transmits or receives a radio signal in a predetermined frequency band, or may include a plurality of antennas performing different roles.

For example, the antenna unit 11, as illustrated in FIG. 1, may include a wireless power transfer (WPT) antenna 114c and a near field communication (NFC) antenna 114a that performing corresponding functions, such as power charging and short-range communication, in different frequency bands.

Since the NFC antenna 114a has a higher frequency band than the WPT antenna 114c, the NFC antenna 114a is formed as a conductive pattern having a rectangular shape with a fine line width along the outer surface of the circuit board 112. Since the WPT antenna 114c is required to transmit power and uses a lower frequency band than the NFC antenna 114a, the WPT antenna 114c may be disposed inside the NFC antenna 114a while having a line width greater than the line width of the NFC antenna 114a.

In addition, the antenna unit 11 may further include a magnetic secure transmission (MST) antenna 114b.

The shielding unit 12 is comprised of a sheet-shaped member having a predetermined area. The shielding unit 12 blocks the magnetic field generated by the antenna unit 11 to prevent leakage of the external force, and focuses the magnetic field in a predetermined direction to improve the characteristics of the antenna.

In this regard, the shielding unit 12 may have a single-layered thin magnetic sheet or may be provided as a stack of a plurality of magnetic sheets.

Figure 13:
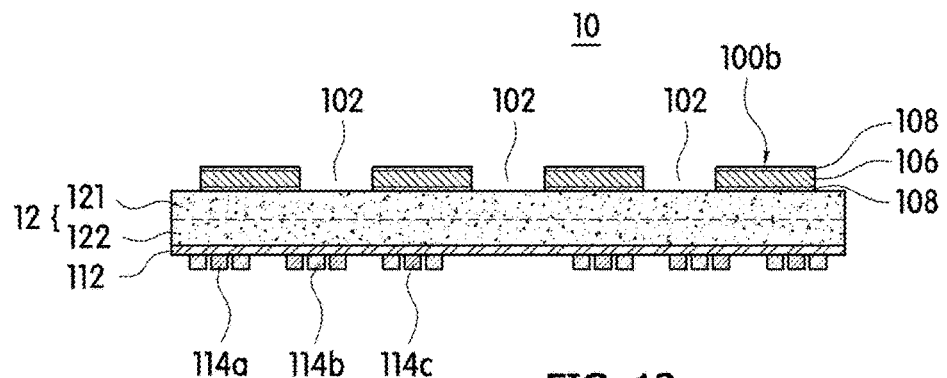
FIG. 13 is a cross-sectional view of FIG. 1.

That is, the shielding unit 12, as illustrated in FIG. 13, may be provided with a first sheet layer 121 and a second sheet layer 122 having different values of magnetic permeability. The first sheet layer 121 may be made of a material having a relatively higher permeability than the second sheet layer 122. In addition, the shielding unit 12 may be a single layer, i.e. one of the first sheet layer 121 and the second sheet layer 122.

The first sheet layer 121 having a relatively higher permeability is intended to improve the characteristics of the WPT antenna 114c, the second sheet layer 122 having a relatively lower permeability is intended to improve the characteristics of the NFC antenna 114a.

The first sheet layer 121 may be a ribbon sheet of an amorphous alloy or a ribbon sheet of a nano-crystalline alloy, and the second sheet layer 122 may be a ferrite sheet.

The amorphous alloy or the nano-crystalline alloy may be an Fe-based or a Co-based magnetic alloy. Considering the material cost, it is preferable to use the Fe-based magnetic alloy. In addition, the amorphous alloy and the nano-crystalline alloy may include a ternary alloy or a quinary alloy. For example, the ternary alloy may include Fe, Si, and B, while the quinary alloy may include Fe, Si, B, Cu, and Nb.

The ferrite sheet may be a sintered ferrite sheet, and may be made of MnZn ferrite or NiZn ferrite. The ferrite sheet may be made of NiZn sintered ferrite.

Figure 14:
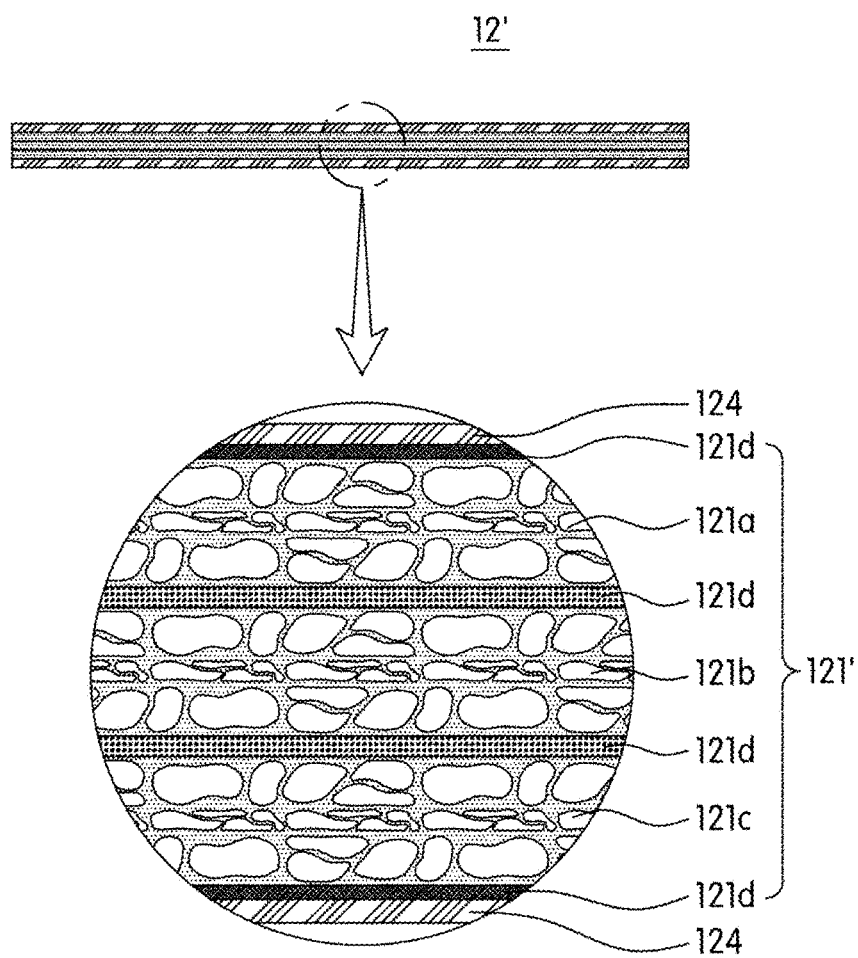
FIG. 14 is a cross-sectional view of another example of the shielding unit in FIG. 13.

It should be noted that the first sheet layer 121, as illustrated in FIG. 14, may be comprised of a plurality of ribbon sheet layers.

In addition, it should be noted that the first sheet layer 121 and the second sheet layer 122 are not limited to the above-mentioned types and any magnetic materials can be used.

At least one of the first sheet layer 121 and the second sheet layer 122 may be comprised of a plurality of fine pieces divided from each other so as to suppress the generation of eddy currents. The plurality of fine pieces may be provided such that adjacent fine pieces may be totally or partially insulated from each other.

The plurality of fine pieces may have sizes of 1 μm to 3 mm, and each of the plurality of fine piece may have irregular random shapes.

In the case in which the shielding unit 12' is comprised of only the first sheet layer 121', which is a stack of a plurality of sheet layers 121a, 121b and 121c, each of which is divided into fine pieces, adhesive layers 121d made of a nonconductive material may be disposed between the respective sheet layers such that the nonconductive material is permeated between each pair of sheet layers stacked on each other. Therefore, the adhesive layer 121d disposed between each pair of sheet layers may serve to insulate a plurality of fine pieces of each sheet layer. In addition, the shielding unit 12' may include protective films 124 on one of the top surface and the bottom surface.

The adhesive layer may be provided as an adhesive or may be provided on one surface or both surfaces of a base material in the form of a film, thereby coating the surface(s).

The heat dissipation unit 100 is disposed on one surface of the shielding unit 12, receives heat, generated from the antenna unit 11 during wireless charging, through the shielding unit 12, and discharges the heat to the outside, thereby improving the charging efficiency of the wireless power charging module 10.

The area of the heat dissipation unit 100 may be substantially the same as the area of the shielding unit 12, such that the entirety of the heat dissipation unit 100 may be provided on one surface of the shielding unit 12. In addition, it should be noted that the area of the heat dissipation unit 100 may be smaller than the area of the shielding unit 12, such that the shielding unit 12 may be provided on a portion of one surface of the shielding unit 12, or a plurality of heat dissipation units 12 may be provided on one surface of the shielding unit 12 so as to be spaced apart from each otherat predetermined distances.

The heat dissipation unit 100 may be a sheet-shaped base layer (or base material layer) having a predetermined area to enlarge the contact area with the heat source sucy that heat generated from the heat source can be rapidly transmitted thereto.

The base layer is made of a material having excellent thermal conductivity. For example, the base layer may be made of one selected from among Cu, Al, graphite, and combinations thereof. In addition, the base layer is not limited to those listed above, but may be made of a metal material having a thermal conductivity of 200 W/m·K or higher.

Here, the heat dissipation unit 100 can suppress the generation of an eddy current on the base layer, thereby improving the wireless charging efficiency and improving the heat dissipation effect.

In this regard, the heat dissipation unit 100 may have one or more slots having a predetermined length in the base layer. The slots 102 may be formed at positions corresponding to the antenna pattern for wireless charging. Thus, the generation of the eddy current can be suppressed during the wireless charging by the slots 102, so that the charging efficiency can be enhanced.

Figure 3:
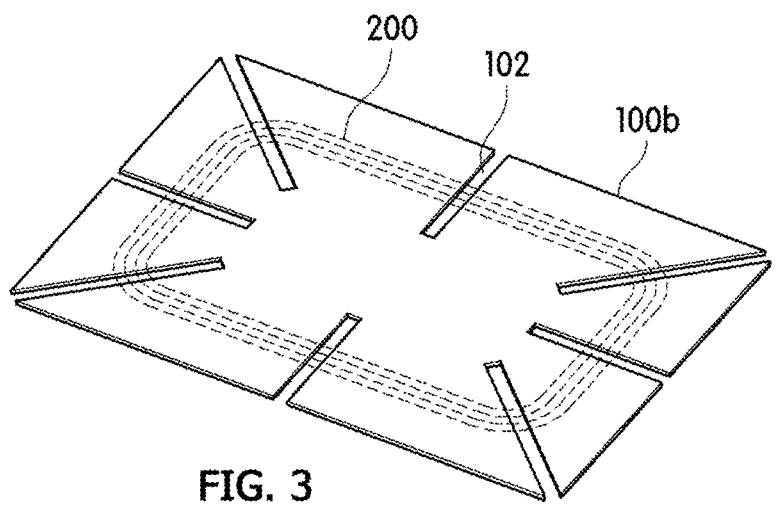

For example, as illustrated in FIG. 3, the slots 102 may extend in the base layer, in directions orthogonal to the antenna pattern 200 for wireless charging. The slots 102 may be formed to extend through the top and bottom of the base layer.

As described above, since the slots 102 are formed in directions orthogonal to the antenna pattern 200 for wireless charging, the function of suppressing the generation of the eddy current can be enhanced to further improve the charging efficiency.

The slots 102 may be formed in various shapes, since the generation of eddy currents can be suppressed by a single slot formed at any position in the base layer of the heat dissipation unit 100.

Figure 2:
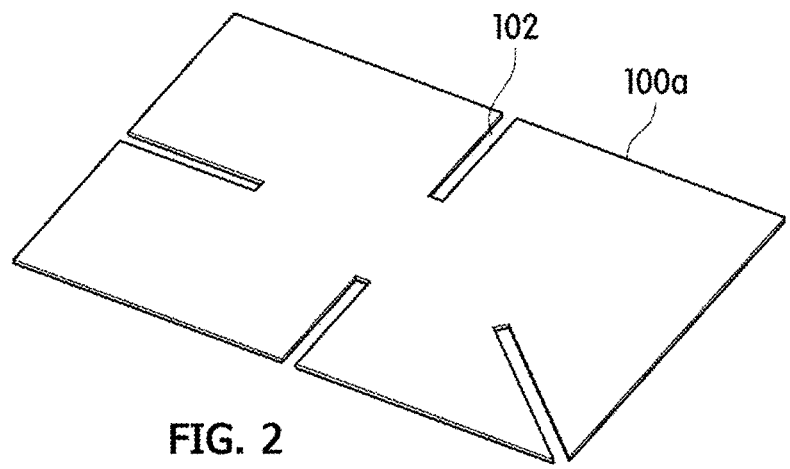
FIGS. 2 to 4 illustrate various forms of a first example of a heat dissipation unit for wireless charging according to an embodiment of the present disclosure.

As illustrated in FIG. 2, the heat dissipation unit 100a may be configured such that the slots 102 extend to corresponding edges of the base layer. Here, the slots 102 may be randomly positioned. For example, each of the slots 102 may be formed at a position corresponding to at least one of four edges of the base layer. Further, each slot 102 may be formed at a position corresponding to one of corners.

Referring to FIG. 2, although it is illustrated and described that the slot 102 is formed orthogonal to one edge of the base layer and is formed at about 45 degrees with respect to the edges, the present disclosure is not limited thereto. The slot may be formed at any angle with respect to one corner or edge of the base layer.

As illustrated in FIG. 3, the heat dissipation unit 100b may be formed in a direction orthogonal to the antenna pattern 200 for wireless charging.

Here, the heat dissipation unit may be formed in a direction orthogonal to the longitudinal direction of the antenna pattern 200 for wireless charging in areas where the antenna pattern 200 for wireless charging is straight (for example, areas parallel to the edges of the heat dissipation unit 100b in FIG. 3).

In addition, the heat dissipation unit may be formed in a direction orthogonal to the tangent of the antenna pattern 200 for wireless charging in areas where the antenna pattern 200 for wireless charging is curved (for example, areas close to the corners of the heat dissipation unit 100b in FIG. 3).

Figure 4:
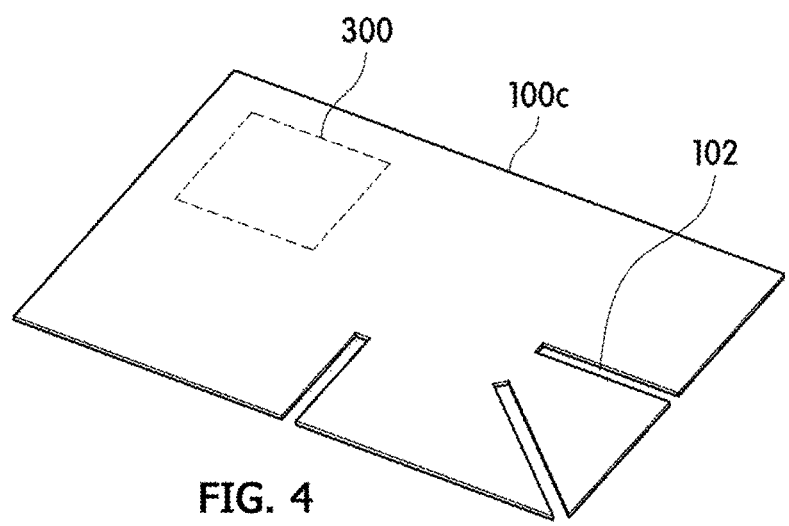

As illustrated in FIG. 4, the heat generating unit 100c may be configured such that the slots 102 are formed concentrically at specific positions.

For example, the slot 102 may not be formed in an area corresponding to a component 300 generating a large amount of heat, such as an application processor (AP), in particular, in an area directly below or above the component 300, but may be formed in an area surrounding or opposite to the component 300 in order to improve the heat dissipation characteristics. That is, since the slot 102 hinders thermal diffusion through the substrate layer, the slot 102 may not be formed in the area corresponding to the high heat-generating component 300, thereby further improving the heat radiation characteristics.

Figure 5:
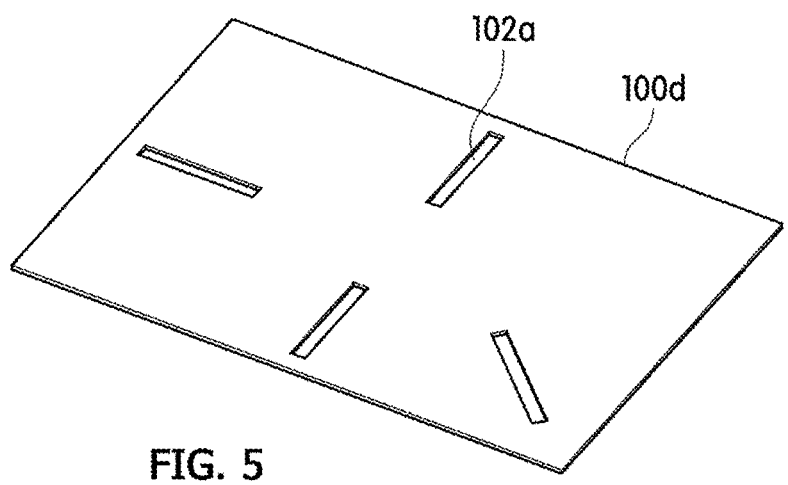
FIGS. 5 and 6 illustrate various forms of a second example of a heat dissipation unit for wireless charging according to an embodiment of the present disclosure.
Figure 6:
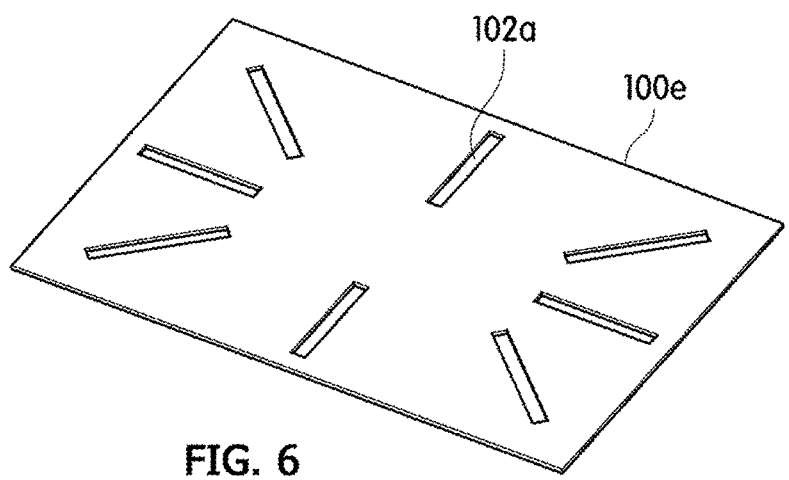

As illustrated in FIGS. 5 and 6, the heat dissipation units 100d and 100e may be configured such that slots 102a are formed in central portions of the base layer without extending to edges of the base layer. The slot 102a may be formed in the central portions of the base layer in order to increase the heat dissipation area for thermal diffusion while being used for suppressing the eddy current.

Figure 7:
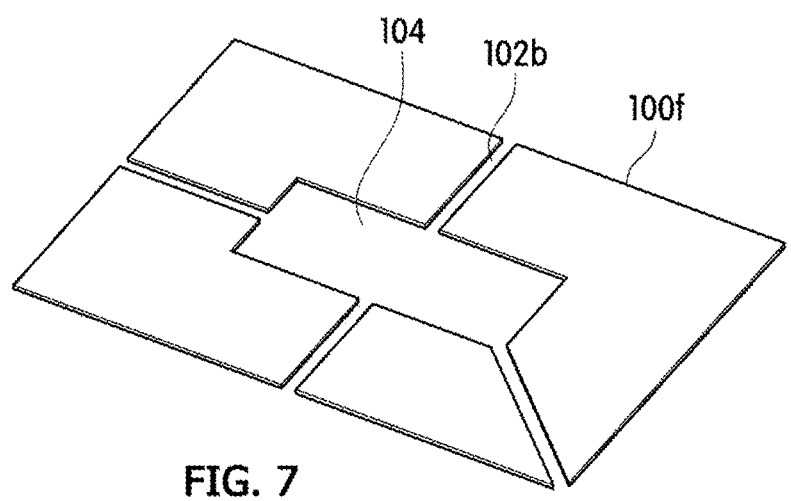
FIGS. 7 and 8 illustrate various forms of a third example of a heat dissipation unit for wireless charging according to an embodiment of the present disclosure.
Figure 8:
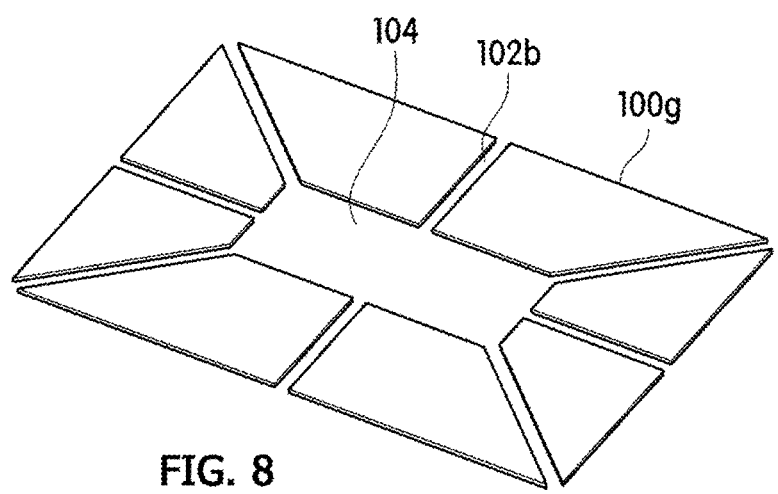

A through-hole 104 may be formed in the central portion of the base layer in consideration of other components to be disposed therein or to be connected to the base layer. As illustrated in FIGS. 7 and 8, the heat dissipation units 100f and 100g may be configured such that slots 102b extend from the through-hole 104 to edges of the base layer.

As described above, slots 102b, 102c, 102d, and 102e formed in the base layer having the through-holes 104 in the central portion may be designed variously according to the positions thereof.

Figure 9:
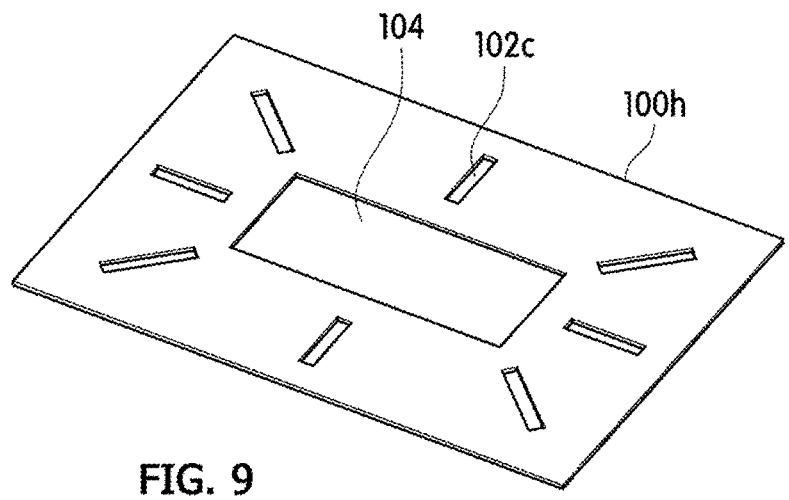
FIGS. 9 to 11 illustrate various forms of a fourth example of a heat dissipation unit according to an embodiment of the present disclosure.

For example, as illustrated in FIG. 9, in the heat dissipation unit 100h, the slots 102c may be formed in central portions of the base layer without being connected to the through-hole 104 or extending to edges of the base layer.

Figure 10:
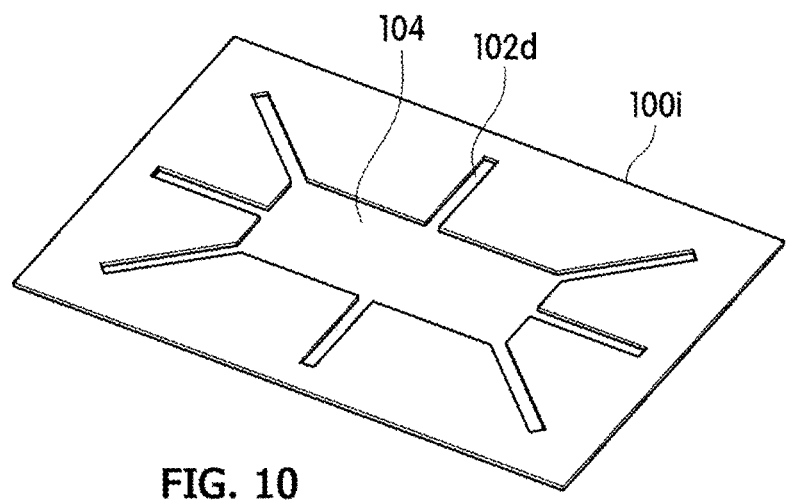

As illustrated in FIG. 10, in the heat dissipation unit 100i, the slots 102d may be formed to be connected to the through-hole 104 without extending to edges of the base layer.

Figure 11:
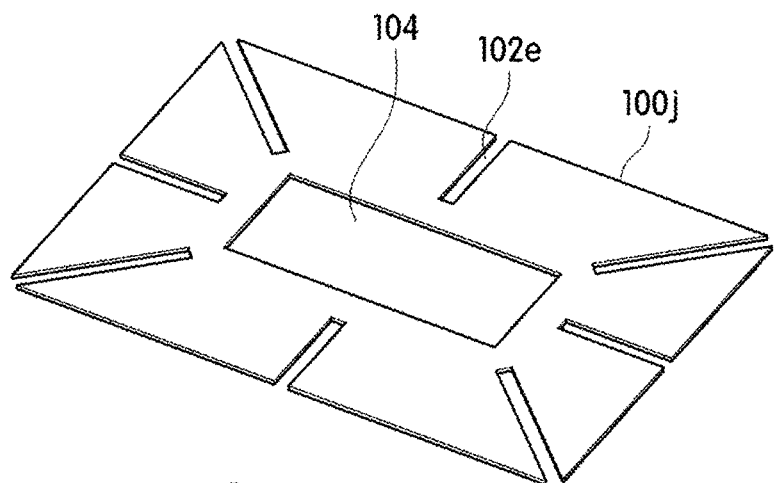

As illustrated in FIG. 11, in the heat dissipation unit 100i, the slots 102e may extend edges of the base layer without being connected to the through-hole 104.

Here, the heat dissipation units 100i and 100j have higher workability than the heat dissipation unit 100g illustrated in FIG. 8, since the base layer is formed integrally without being divided into individual pieces by the slots. This can facilitate mass production of the heat dissipation units 100i and 100j.

In addition, although not illustrated in the drawings, in order to further improve the heat dissipation effect of the heat dissipation unit 100, the heat dissipation unit 100 may further include a heat conductive adhesive disposed on at least one of the top surface and the bottom surface of the base layer.

In addition, the heat dissipation unit 100k can improve the heat dissipation effect by increasing the emissivity while reducing the overall thickness and can improve the charging efficiency by increasing the resistance value and suppressing the generation of the eddy current.

Figure 12:
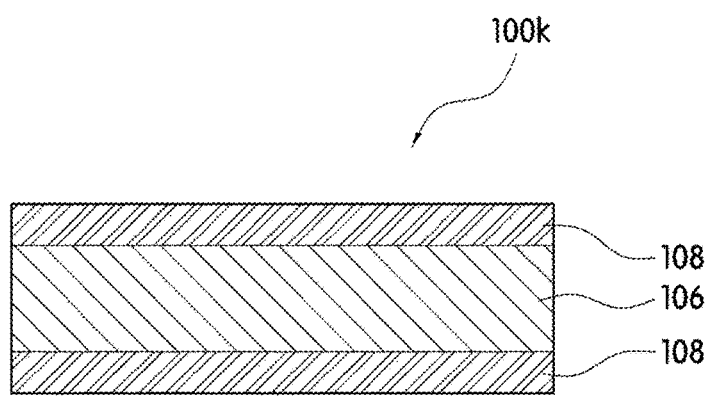
FIG. 12 is a cross-sectional view of an example of a heat dissipating unit for wireless charging according to an embodiment of the present disclosure.

In this regard, as illustrated in FIG. 12, the heat dissipation unit 100k may include a base layer 106 and an oxide film 108 provided on at least one surface of the top surface and bottom surface of the base layer 106. Preferably, the oxide film 108 may be provided on both the top and bottom surfaces of the base layer 106.

The metal material of the base layer 106 may have excellent thermal conductivity, and preferably, may be one selected from among Cu, Al, graphite, and combinations thereof.

In the heat dissipation unit 100k according to the present disclosure, an oxide film made of, for example, CuO or $Cu_2O$, is formed by oxidizing the surface of the metal layer of the heat dissipation unit 100k by blackening treatment.

Therefore, it is possible to minimize cracking by preventing corrosion, improve the degree of close contact and adhesion by increasing the surface area, and increase the emissivity of the material, thereby improving the heat dissipation characteristics without increasing the overall thickness.

In addition, the oxide layer 108 formed on the surface of the metal layer functions as an insulating layer to increase the overall resistance. This consequently reduces the generation of eddy currents, thereby further increasing the charging efficiency. Accordingly, it is not necessary to provide a separate member as an additional layer to increase the resistance value in order to reduce the generation of eddy current, and thus the heat dissipation characteristics required in the wireless charging method can be realized without increasing the overall thickness.

Figure 15:
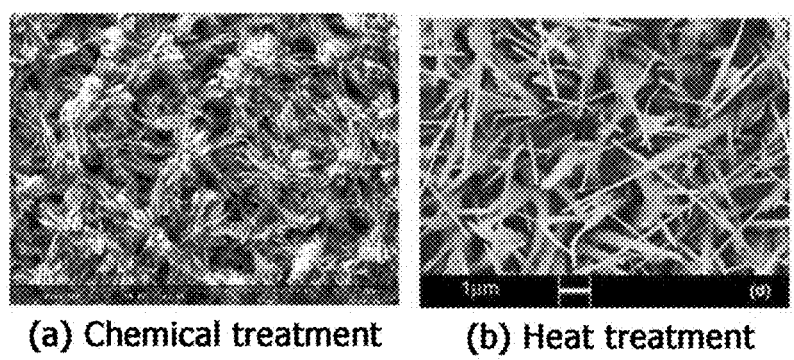
FIG. 15 is an enlarged view of an oxide film in a heat dissipation unit for wireless charging according to an embodiment of the present disclosure, wherein a) illustrates an image of the chemically-treated oxide film, and b) illustrates an image of the heat-treated oxide film.

The blackening treatment, as illustrated in FIG. 15, may be performed using a chemical, heat treatment, or plasma treatment.

It should be noted that the heat dissipation unit 100 for wireless charging and the wireless power charging module 10 including the same according to an embodiment of the present disclosure may be applied to a Qi method or may be applied to PMA-type wireless charging, with a separate attractor (not shown) for inducing a magnetic force line being provided between the shielding unit 12 and the antenna unit 11. In addition, it should be noted that the wireless power charging module 10 may be provided in a form attached to a back cover of an electronic device such as a portable terminal when the wireless power charging module 10 is used as a receiving module.

Although the foregoing embodiments of the present disclosure have been described above, the spirit of the present disclosure is not limited to the embodiments set forth herein. Those skilled in the art who understands the spirit of the present disclosure may readily suggest other embodiments by adding, changing, deleting, or the like to components within the scope of the same concept, and all such changes are included within the spirit of the present disclosure.

The invention claimed is:

1. A heat dissipation unit for wireless charging, comprising:
 a sheet-shaped base layer through which heat generated during wireless charging is discharged outwardly, the base layer having at least one slot,
 wherein the slot extends in a direction orthogonal to a pattern of an antenna for wireless charging,
 wherein the slot is formed in central portions of the base layer without extending to edges of the base layer, and
 wherein the slot is disposed concentrically at some positions corresponding to a pattern of an antenna for wireless charging, except for an area corresponding to an application processor to improve a heat dissipation characteristic.

2. The heat dissipation unit of claim 1, wherein the slot is disposed at a position corresponding to a pattern of an antenna for wireless charging, except for an area corresponding to an application processor to improve a heat dissipation characteristic.

3. The heat dissipation unit of claim 1, wherein the slot extends through top and bottom of the base layer.

4. The heat dissipation unit of claim 1, wherein the slot extends to an edge of the base layer.

5. The heat dissipation unit of claim 1, wherein the base layer has a through-hole in a central portion thereof, and the slot extends to the through-hole or extends from the through-hole to an edge of the base layer.

6. The heat dissipation unit of claim 1, wherein the base layer is made of one selected from among Cu, Al, graphite, and combinations thereof.

7. The heat dissipation unit of claim 1, further comprising:
 a heat conductive adhesive disposed on at least one surface of a top surface and a bottom surface of the base layer.

8. The heat dissipation unit of claim 1, further comprising:
 an oxide film disposed on at least one surface of a top surface and a bottom surface of the base layer.

9. A wireless power charging module, comprising:
 at least one antenna unit;
 a shielding unit disposed on a surface of the antenna unit to induce a magnetic field; and
 a heat dissipation unit comprising a sheet-shaped base layer disposed on a surface of the shielding unit to discharge heat,
 wherein the base layer has at least one slot,
 wherein the slot extends in a direction orthogonal to a pattern of the antenna of the antenna unit,
 wherein the slot is formed in central portions of the base layer without extending to edges of the base layer, and
 wherein the slot is disposed concentrically at some positions corresponding to a pattern of an antenna for wireless charging, except for an area corresponding to an application processor to improve a heat dissipation characteristic.

10. The wireless power charging module of claim 9, wherein the antenna unit comprises at least one of a wireless charging antenna, a near field communication (NFC) antenna, and a magnetic secure transmission (MST) antenna.

11. The wireless power charging module of claim 10, wherein the shielding unit comprises a first sheet layer for improving a characteristic of the wireless charging antenna and a second sheet layer for improving a characteristic of the NFC antenna.

12. The wireless power charging module of claim 11, wherein the first sheet layer is a ribbon sheet made of an amorphous alloy or a nano-crystalline alloy, and the second sheet layer is a ferrite sheet.

13. The wireless power charging module of claim 11, wherein at least one of the first sheet layer and the second sheet layer is comprised of a plurality of fine pieces divided into irregular shapes, adjacent fine pieces among the plurality of fine pieces being totally insulated or partially insulated from each other.

14. A heat dissipation unit for wireless charging, comprising:
 a metal thin film,
 wherein the metal thin film sheet includes an oxide film layer disposed on one surface or both surfaces to improve high-resistance properties and emissivity of the surfaces,
 wherein the metal thin film sheet has at least one slot,
 wherein the heat dissipation unit is installed in a shielding unit of a wireless power charging module to dissipate heat generated from a heat source,
 wherein the slot extends in a direction orthogonal to a pattern of an antenna for wireless charging,
 wherein the slot is formed in central portions of the base layer without extending to edges of the base layer, and
 wherein the slot is disposed concentrically at some positions corresponding to a pattern of an antenna for wireless charging, except for an area corresponding to an application processor to improve a heat dissipation characteristic.

15. The wireless power charging module of claim 14, wherein the metal thin film sheet is a copper foil.

16. The wireless power charging module of claim 14, wherein the slot is disposed at a position corresponding to a pattern of an antenna for wireless charging, except for an area corresponding to an application processor (AP) to improve a heat dissipation characteristic.

* * * * *